United States Patent [19]
Ueno et al.

[11] Patent Number: 5,525,924
[45] Date of Patent: Jun. 11, 1996

[54] LOG CONVERSION CIRCUIT

[75] Inventors: Takashi Ueno, Yokohama; Mikio Koyama, Tokyo; Hiroshi Tanimoto, Kawasaki, all of Japan

[73] Assignee: Kabushiki Kaisha Toshiba, Kawasaki, Japan

[21] Appl. No.: 306,367

[22] Filed: Sep. 15, 1994

[30] Foreign Application Priority Data

Sep. 16, 1993 [JP] Japan .................... 5-229960

[51] Int. Cl.$^6$ .................................... H03G 11/08
[52] U.S. Cl. ............................ 327/350; 327/563
[58] Field of Search ....................... 327/346–353, 327/504, 505, 560, 563; 330/254, 256

[56] References Cited

U.S. PATENT DOCUMENTS 3,870,964  3/1975  Mills ........................ 330/29
5,162,678  11/1992  Yamasaki ................. 327/350

FOREIGN PATENT DOCUMENTS

61-224715  10/1986  Japan .

Primary Examiner—Timothy P. Callahan
Assistant Examiner—Toan Tran
Attorney, Agent, or Firm—Finnegan, Henderson, Farabow, Garrett & Dunner

[57] ABSTRACT

A log conversion circuit comprising first and second input terminals to which voltage signals are input, first and second resistors, first ends of which are respectively connected to the first and second input terminals, first and second PN junction element sections connected in series and in opposite polarities, between a second end of the first resistor and a second end of the second resistor, a biasing circuit connected between a first source terminal and a node between the first and second PN junction element sections, first and second current sources for determining potentials at both ends of the first resistor, the first current source means connected between the first end of the first resistor and the first and second source terminals, and the second current source means being connected between the second end of the first resistor and the first and second source terminals, third and fourth current sources for determining potentials at both ends of the second resistor, the third current source means connected between the first end of the second resistor and the first and second source terminals, and the fourth current source means being connected between the second end of the second resistor and the first and second source terminals, and first and second output terminals for outputting voltage signals generated in the first and second PN junction element sections.

9 Claims, 11 Drawing Sheets

$$V_{min} = R_E \cdot I_P + 2 \cdot V_{BE} + V_{CE}$$

PRIOR ART
FIG. 5

$$V_{min} = V_{BE} + V_{CE}$$

PRIOR ART

LOG CONVERSION CIRCUIT

BACKGROUND OF THE INVENTION

1. Field of the Invention

The present invention relates to a log conversion circuit adapted for an electronic device driven by a low source voltage, e.g., a portable communication device.

2. Description of the Related Art

A type of log conversion circuit log-converts an input signal, utilizing the fact that a base-emitter voltage and a collector current of a bipolar transistor have a logarithmic relation or that a forward voltage and a collector current of a diode have a logarithmic relation. The log conversion circuit is often used as a variable gain circuit, called a gain cell circuit, in combination with an antilog conversion circuit connected to its output side.

Figure 1:
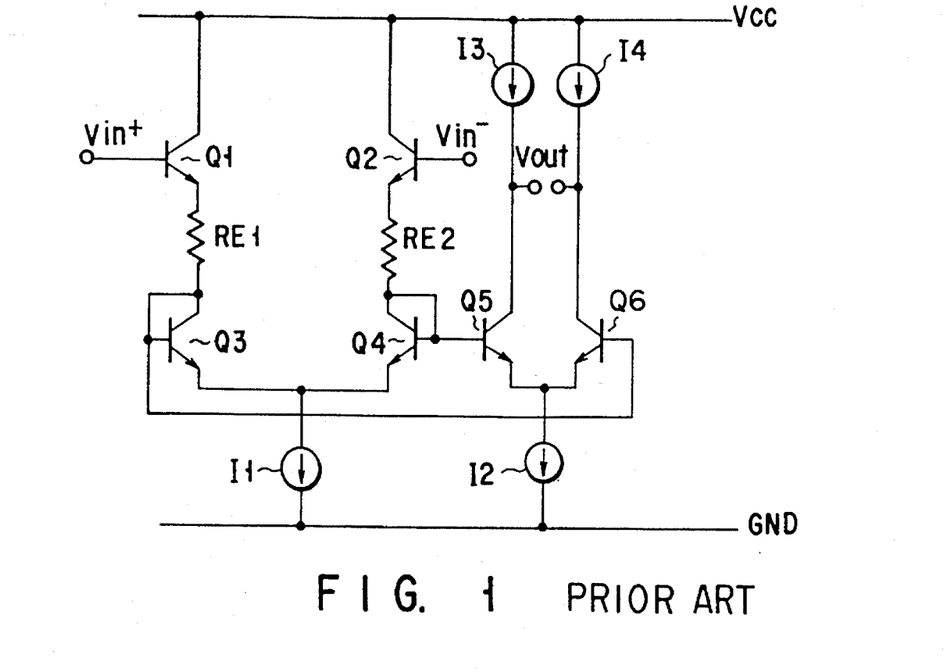
FIG. 1 is a circuit diagram showing a conventional gain cell circuit (variable gain circuit)

FIG. 1 shows a conventional gain cell circuit using a conventional log conversion circuit. This gain cell circuit, used as an element of an active filter circuit, is disclosed in Jpn. Pat. Appln. KOKAI Publication No. 61-224715. A log conversion circuit on an input stage includes transistors Q1, Q2, Q3 and Q4, degeneration resistors RE1 and RE2 and a current source I1. An antilog conversion circuit includes transistors Q5 and Q6 and current sources I2, I3 and I4.

In the log conversion circuit, input signals Vin (Vin$^+$, −Vin$^-$) applied to the bases of the transistors Q1 and Q2 are voltage-current converted by the transistors Q1 and Q2. Emitter currents of the transistors Q1 and Q2 are respectively supplied to the collectors of the transistors Q3 and Q4 through the resistors RE1 and RE2.

A collector current Ic of the diode-connected transistors Q3 and Q4 and a base-emitter voltage Vbe have the following relationship:

$$Vbe = \alpha \cdot \ln(Ic).$$

Collector currents of the transistors Q3 and Q4 are therefore log-converted and output as base-emitter voltages of the transistors Q3 and Q4. The output voltages are received by the bases of the transistors Q5 and Q6 of the antilog conversion circuit on an output stage of the gain cell circuit. As a result, the signals Vin input to the log conversion circuit of the input stage are linearly converted and output from the collectors of the transistors Q5 and Q6.

Figure 2:
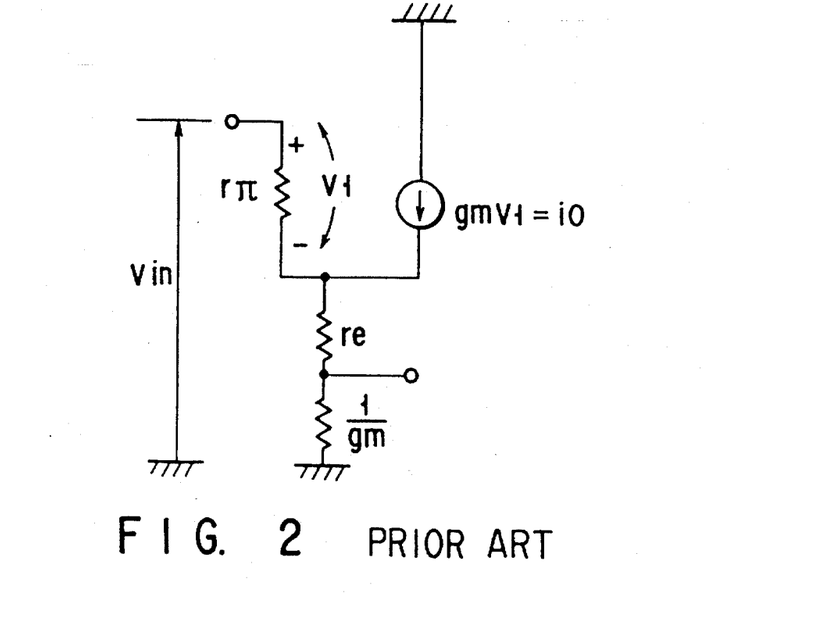
FIG. 2 is an equivalent circuit diagram for explaining an operation principle of the circuit shown in FIG. 1.

FIG. 2 shows an equivalent circuit of the log conversion circuit on the input stage shown in FIG. 1. Since the log conversion circuit as shown in FIG. 1 performs a differential operation, the equivalent circuit shown in FIG. 2 is indicated in a half-circuit form. When the resistance of the degeneration resistors RE1 and RE2 is represented by "re" and the current of the current source I1 is represented by "i (mA)", a maximum range of an input voltage, i.e., a maximum amplitude range Vinp-p of the input signal Vin, is represented by the following equation:

$$Vinp\text{-}p = 100 \cdot re(i(mA)/26)(mV) \tag{1}$$

As is evident from the equation (1), in order to increase the range of the linear operation of the gain cell circuit, it is necessary that the current "i" or the resistance "re" be increased. However, an increase in the current "i" is not desirable, since it increases the amount of power which is consumed when no signal is generated. On the other hand, if the resistance "re" is increased, the source voltage must be greater in accordance with the resistance, since the voltage drop in the resistors RE1 and RE2 also increases.

In the log conversion circuit shown in FIG. 1, the transistors Q1 and Q3 (Q2 and Q4) and the resistor RE1 (RE2) are connected in series between a power source Vcc and a ground terminal GND. Hence, the source voltage must be higher than the sum of the base-emitter voltage of the transistors Q1 and Q2 (Q3 and Q4) and the voltage drop in the resistor RE1 (RE2) due to a DC bias current of the transistors Q1 and Q2 (Q3 and Q4). Since the voltage drop in the resistors RE1 and RE2 is great as described above, the log conversion circuit is not suitable for a low-voltage operation. In other words, since the voltage amplitude range of an input signal, which can be log-converted, is restricted due to the voltage required to operate the transistor, an input signal of an electronic device driven by a low source voltage (e.g., a portable communication device) cannot have a sufficiently wide voltage amplitude range.

As described above, the conventional log conversion circuit is not suitable for a low-voltage operation, since the source voltage must be higher than the sum of the base-emitter voltage of two transistors and the voltage drop in a resistor due to a DC bias current of the transistors. Accordingly, when the source voltage is not sufficiently high, it is impossible to perform a log converting operation over a wide range of voltage amplitude of an input signal.

SUMMARY OF THE INVENTION

It is accordingly an object of the present invention to provide a log conversion circuit which operates over a wide range of voltage amplitude with a lower source voltage as compared to that required in the conventional log conversion circuit.

The above object can be achieved by a log conversion circuit comprising:

first and second input terminals to which voltage signals are input;

first and second voltage/current converting means for converting the voltage signals input to the first and second input terminals to current signals;

a log element section, connected between the first and second voltage/current converting means, so that differences in the current signals obtained from the first and second voltage/current converting means can flow therethrough, the log element section including first and second PN junction elements connected in series in opposite polarities; and first and second output terminals for outputting voltage signals generated at both ends of the log element section.

In the above log conversion circuit, differences in the current signals obtained from the first and second voltage/current converting means flow through the log element section. Voltages corresponding to the differences in the current signals are obtained through the first and second output terminals.

The above object can be achieved also by a log conversion circuit comprising:

first and second input terminals to which voltage signals are input;

first and second resistors, first ends of which are respectively connected to the first and second input terminals;

first and second PN junction element sections connected in series and in opposite polarities, between a second end of the first resistor and a second end of the second resistor;

a biasing circuit connected between a first source terminal and a node between the first and second PN junction element sections;

first and second current source means for determining potentials at both ends of the first resistor, the first current source means connected between the first end of the first resistor and the first and second source terminals, and the second current source means being connected between the second end of the first resistor and the first and second source terminals;

third and fourth current source means for determining potentials at both ends of the second resistor, the third current source means connected between the first end of the second resistor and the first and second source terminals, and the fourth current source means being connected between the second end of the second resistor and the first and second source terminals; and first and second output terminals for outputting voltage signals generated in the first and second PN junction element sections.

Further, the above object can be achieved by a log conversion circuit comprising:

first and second input terminals to which voltage signals are input;

first and second emitter followers, bases of which are respectively connected to the first and second input terminals;

first and second resistors, first ends of which are respectively connected to emitters of the first and second emitter followers;

first and second PN junction element sections connected in series and in opposite polarities, between a second end of the first resistor and a second end of the second resistor;

a biasing circuit connected between a first source terminal and a node between the first and second PN junction element sections;

first and second current source means for determining potentials at both ends of the first resistor, the first current source means connected between the first end of the first resistor and the first and second source terminals, and the second current source means being connected between the second end of the first resistor and the first and second source terminals;

third and fourth current source means for determining potentials at both ends of the second resistor, the third current source means connected between the first end of the second resistor and the first and second source terminals, and the fourth current source means being connected between the second end of the second resistor and the first and second source terminals;

first and second output terminals for outputting voltage signals generated in the first and second PN junction element sections;

a pair of emitter-coupled transistors, bases of which are respectively connected to the ends of the first and second resistors, emitters of which are connected to each other to form a common emitter terminal, and collectors of which are respectively connected to the emitter of the second emitter follower and the emitter of the first emitter follower; and a current source connected to the common emitter terminal of the pair of emitter-coupled transistors.

The above log conversion circuit operates as follows. Input signals applied to the first and second input terminals are supplied to the first and second resistors directly or through the first and second emitter followers. The signals are voltage/current converted by the first and second resistors, and log-converted by the first and second PN junction elements. As a result, output signals obtained by log-converting the input signals are output through the first and second output terminals.

In the log conversion circuit, a voltage drop in the biasing circuit for the PN junction elements, a voltage drop in the first or second resistor and a voltage drop in one of the first and second current source means are inserted in series between the first and second source terminals, the difference between the voltages of the first and second source terminals must be at least the sum of the three voltage drops. According to the present invention, the first and second current source means operate so as to allow a DC current, which does not depend on input signals, to flow little through the first and second resistors. The voltage drops in the first and second resistors are thus set to be low, so that only a small amount of source voltage is required. In other words, the log conversion circuit can be operated at a lower voltage than in the conventional circuit. Alternatively, if the source voltage is the same as that in the conventional circuit, the log converting operation can be performed in a wider range of the voltage amplitude of an input signal.

Furthermore, if a pair of emitter-coupled transistors are connected so that the bases thereof cross the emitters of the first and second emitter followers, the current dependencies of the base-emitter voltages of the transistors of the emitter followers and the forward voltages of the PN junction elements can be eliminated. The first and second resistors thus perform a more accurate voltage/current conversion, with the result that the log conversion accuracy can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 3:
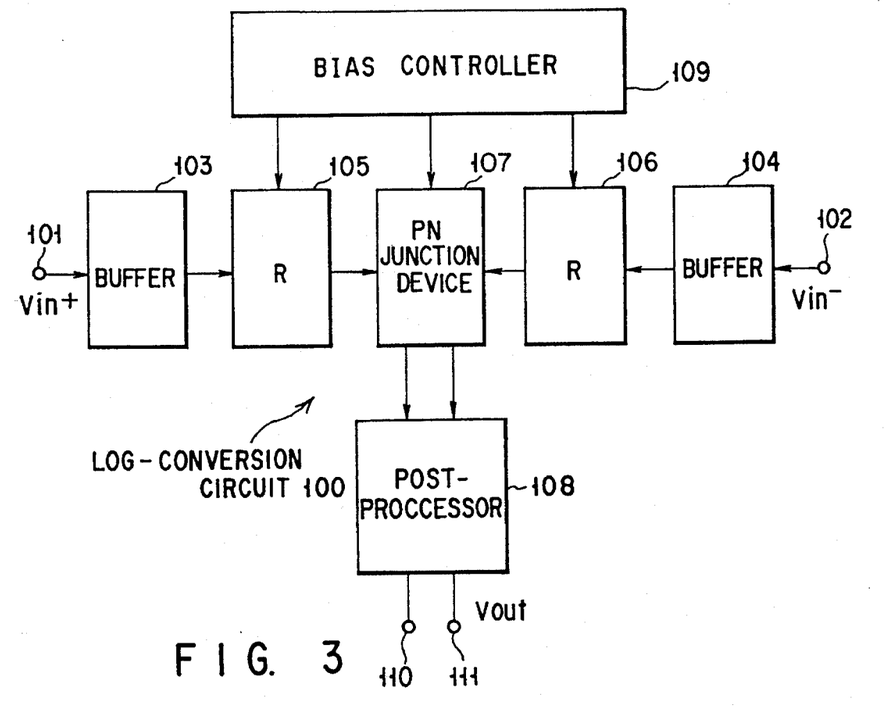
FIG. 3 is a basic circuit diagram showing a gain cell circuit according to the present invention.

Embodiments of the present invention will be described with reference to the accompanying drawings. A basic circuit of a log conversion circuit of an embodiment of the present invention is typically shown in FIG. 3. As shown in FIG. 3, a log conversion circuit 100 comprises first and second input terminals 101 and 102, first and second buffers 103 and 104, first and second degeneration resistors 105 and 106, a PN junction device 107, a post-processor 108, a bias controller 109 and first and second output terminals 110 and 111.

In the above circuit, voltage signals are input to the first and second input terminals 101 and 102. The first and second buffers 103 and 104 convert impedances of the voltage signals input to the first and second input terminals 101 and 102.

The first and second degeneration resistors 105 and 106 convert voltage signals output from the first and second buffers 103 and 104 into current signals. The first and second generation resistors 105 and 106 are connected to the log element section 107, so that differences in the current signals output from the first and second degeneration resistors 105 and 106 can flow therethrough.

The PN junction device 107 includes first and second PN junction elements 107A and 107B serially connected in opposite polarizations. Differences in the current signals output from the first and second degeneration resistors 105 and 106 flow into the PN junction device 107. Each of the first and second PN junction elements 107A and 107B is a diode element or a diode-connected transistor element, which is constituted by a diode or diodes, or a transistor or transistors.

A post-processor 108 post-processes outputs from the PN junction device 107. More specifically, the post-processor 108 is a linearizing circuit and/or a level shift circuit. A linearizing circuit expands a linearizing operation range of outputs (output voltages) from the PN junction device 107. A level shift circuit shifts the DC potentials of voltage signals output through the first and second output terminals 110 and 111 corresponding to the DC potentials of the voltage signals input to the first and second input terminals 101 and 102. In general, the level shift circuit operates so that the DC potentials of voltage signals output through the first and second output terminals 110 and 111 coincide with those of voltage signals input to the first and second input terminals 101 and 102.

The bias controller 109 applies a necessary current and/or voltage bias to a circuit including at least the first and second degeneration resistors 105 and 106 and the PN junction device 107. Voltage signals generated at both terminals of the PN junction device 107 are output through the first and second output terminals 110 and 111.

Figure 4:
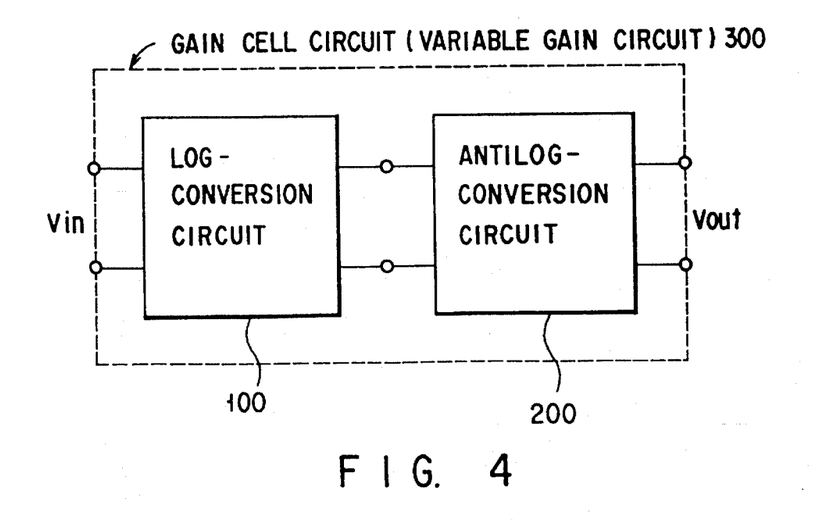
FIG. 4 is a basic circuit diagram showing a log conversion circuit according to the present invention.

Further, as shown in FIG. 4, a gain cell circuit (variable gain circuit) 300 is constituted by the aforementioned log conversion circuit 100 and an antilog conversion circuit 200 for antilog-converting logarithmic outputs (voltage signals output through the first and second output terminals) of the log conversion circuit 100. The gain cell circuit (variable gain circuit) 300 is utilized as an active filter for use in electronic devices such as a communication device, TV or VCR. Since the gain cell circuit (variable gain circuit) 300, having the log conversion circuit 100 of the present invention, is operable even with a low voltage source, it is applicable to an active filter of a portable communication device, such as a portable telephone.

The principle of the present invention will be described with reference to FIGS. 5 and 6, in comparison with the conventional art.

Figure 5:
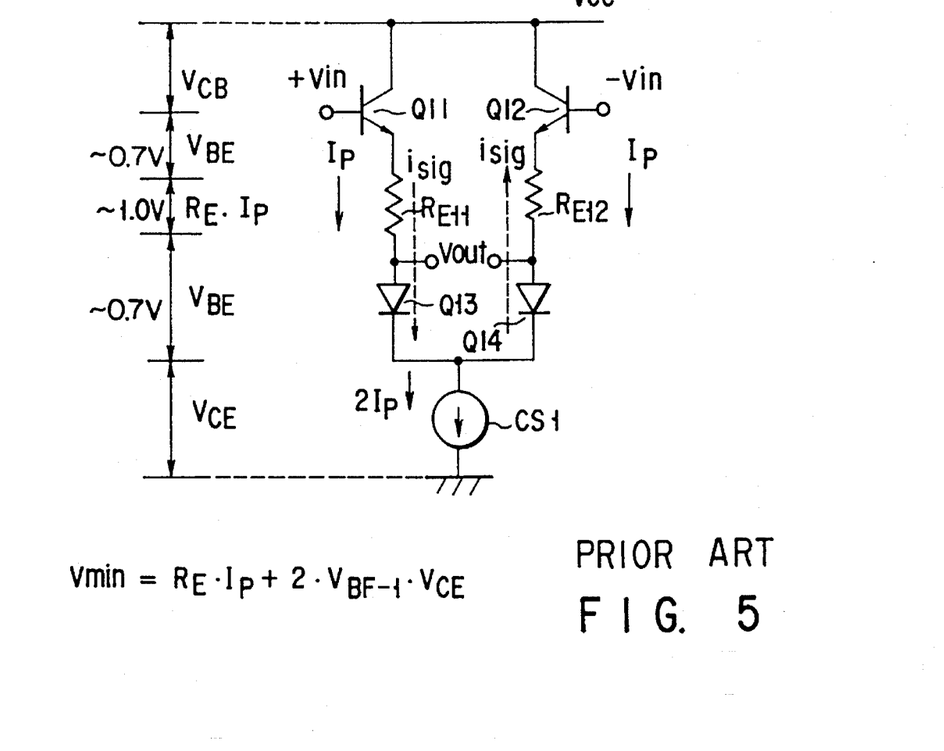
FIG. 5 is a circuit diagram showing an operation principle of the gain cell circuit (variable gain circuit) shown in FIG. 1.

A conventional log conversion circuit shown in FIG. 5 comprises first and second serial circuits connected between a power source $V_{cc}$ and the ground. The first serial circuit includes an emitter follower Q11, a degeneration resistor $R_E11$ and a PN junction element Q13. The second serial circuit includes an emitter follower Q12, a degeneration resistor $R_E12$ and a PN junction element Q14. A current source CS1 is inserted between the ground and the first and second serial circuits.

In this conventional circuit, logarithmic outputs are obtained from output terminals $V_{out}$ provided in the first and second serial circuits. In other words, the conventional log conversion circuit shown in FIG. 5 outputs, as logarithmic outputs, voltage values obtained by log-converting the values of voltages corresponding to the values of currents flowing through the degeneration resistors $R_E11$ and $R_E12$ of the first and second serial circuits. In the conventional log conversion circuit, a voltage drop in the first and second serial circuits is $V_{CB}+V_{BE}+R_E \cdot I_p+V_{BE}+V_{CE}$. A minimum input voltage $V_{min}$ required for normally operating the log conversion circuit is as follows:

$$V_{min}=R_E \cdot I_p+2V_{BE}+V_{CE}$$

Figure 6:
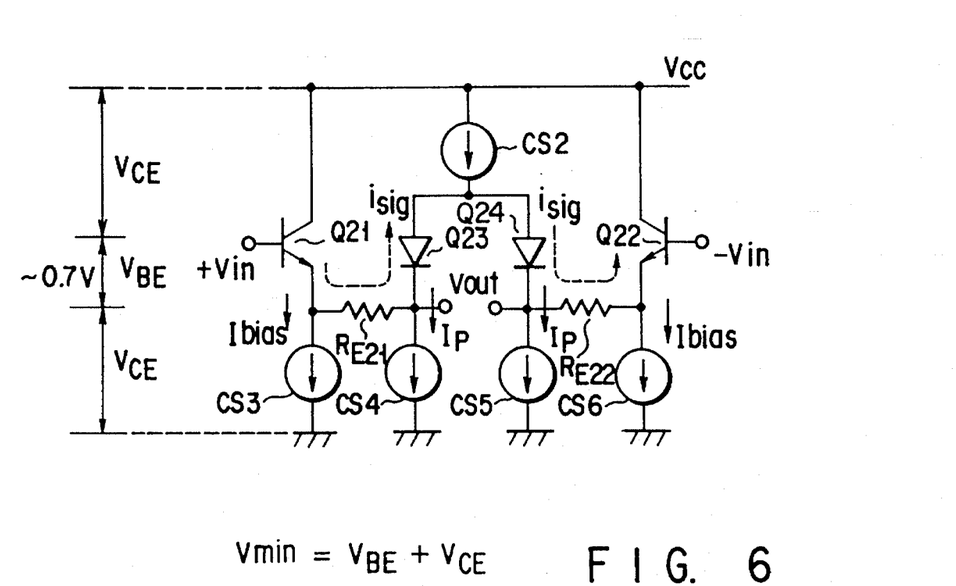
FIG. 6 is a circuit diagram showing a principle of a log conversion circuit of the present invention.

In contrast, in the log conversion circuit of the present invention shown in FIG. 6, emitter followers Q21 and Q22, for receiving input signals, are connected between a power source $V_{cc}$ and the ground via power sources CS3 and CS6, respectively. First and second PN junction elements Q23 and Q24, serially connected in opposite polarizations, are connected between the power source $V_{cc}$ and the ground. A current source CS2 is inserted between the power source and the first and second PN junction elements Q23 and Q24. Current sources CS4 and CS5 are inserted between the ground and the first and second PN junction elements Q23 and Q24, respectively. The emitter followers Q21 and Q22 are respectively connected to the first and second PN junction elements Q23 and Q24 via the degeneration resistors $R_E21$ and $R_E22$. With this structure, outputs from the emitter follower Q21 and Q22 are converted by the degeneration resistors $R_E21$ and $R_E22$ into current signals. Thus, voltage signals corresponding to differences in the current signals flowing through the degeneration resistors $R_E21$ and $R_E22$ are output through first and second output terminals $V_{out}$ connected to the first and second PN junction elements Q23 and Q24.

In the circuit of the present invention, logarithmic outputs are obtained through the output terminals $V_{out}$ connected to the first and second PN junction elements Q23 and Q24. In other words, the log conversion circuit shown in FIG. 6 outputs, as log conversion outputs, voltage values obtained by log-converting the voltage values corresponding to differences in the current signals flowing through the degeneration resistors $R_E21$ and $R_E22$. In the circuit of the present invention, a voltage drop in the circuit connecting a first or second input terminal and a first or second output terminal is $V_{CB}+V_{BE}+R_E \cdot I_p+V_{BE}+V_{CE}$. A minimum input voltage $V_{min}$ required for normally operating the log conversion circuit shown in FIG. 6 is $V_{BE}+V_{CE}$.

As described above, the minimum input voltage $V_{min}$ required for normal operation can be reduced as compared to that in the conventional circuit. Since the gain cell circuit (variable gain circuit) having the log conversion circuit of the present invention is thus operable with a low source voltage, it can be applicable to an active filter for use in a portable communication device, such as a portable telephone.

Preferred embodiments of a log conversion circuit and a gain cell circuit (variable gain circuit) of the present invention will be described in detail with reference to FIGS. 7 to 18.

Figure 7:
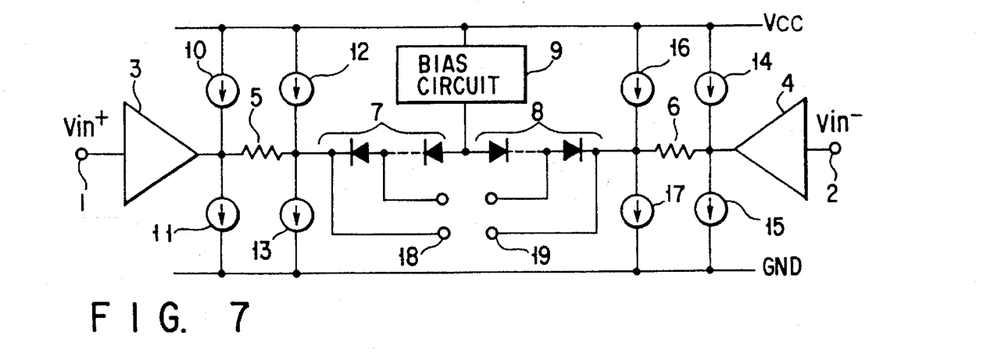
FIG. 7 is a circuit diagram showing a log conversion circuit according to a first embodiment of the present invention.
Figure 8:
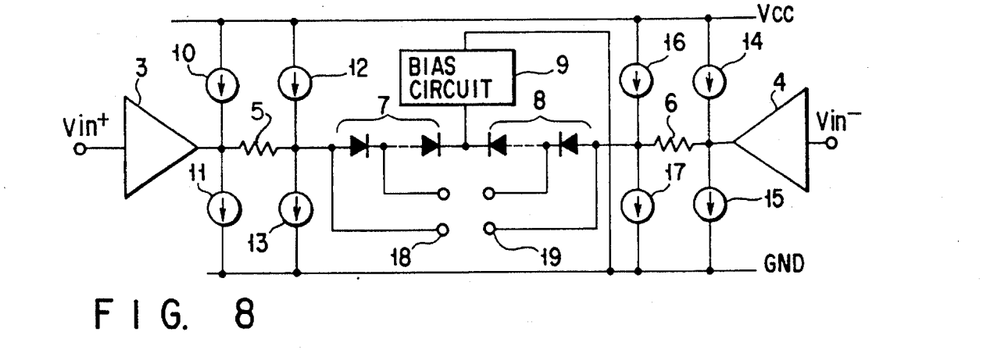
FIG. 8 is a circuit diagram showing a log conversion circuit according to a second embodiment of the present invention.

FIGS. 7 and 8 are circuit diagrams respectively showing first and second embodiments of the log conversion circuit of the present invention. In these embodiments, first and second input terminals 1 and 2 are respectively connected to first ends of first and second resistors 5 and 6 via buffers 3 and 4 having emitter followers. The resistors 5 and 6 serve as degeneration resistors. First and second PN junction elements 7 and 8 are serially connected in opposite polarizations between the other end of the resistor 5 and the other end of the resistor 6. More specifically, in the embodiment of FIG. 7, the cathodes of the PN junction elements 7 and 8 are connected to the other end of the first resistor 5 and the other end of the second resistor 6, and the anodes thereof are connected to each other. In the embodiment of FIG. 8, in contrast, the anodes of the PN junction elements 7 and 8 are respectively connected to the other end of the first resistor 5 and the other end of the second resistor 6, and the cathodes thereof are connected to each other.

Although each of the PN junction elements 7 and 8 is constituted by a plurality of diodes connected in series in the embodiments shown in FIGS. 7 and 8, it can be replaced by one diode. Further, each of the PN junction elements 7 and 8 can be a so-called "diode-connected transistor", in which the collector and the base are connected.

A biasing circuit 9 for applying a forward bias to the PN junction elements 7 and 8 is inserted between a first source terminal (a power source $V_{cc}$) and the node between the first and second PN junction elements. Either a current source or a voltage source can be used as the biasing circuit 9.

A first end of the resistor 5 is connected to first ends of current sources 10 and 11 and the other end of this resistor is connected to first ends of current sources 12 and 13. Likewise, a first end of the resistor 6 is connected to first ends of current sources 14 and 15 and the other end of this resistor is connected to first ends of current sources 16 and 17. The other ends of the current sources 10, 12, 14 and 16 are connected to the power source $V_{cc}$, and the other ends of the current sources 11, 13, 15 and 17 are connected to a second source terminal (a ground terminal GND). These current sources 10 to 17 are used to determine voltage drops in the resistors 5 and 6, i.e., the potentials at both ends of the resistors. The current source 11 is not necessarily required, but is required only when a linearizing circuit is added, as will be described later.

An output terminal 18 is connected to a node between the PN junction element 7 and the other end of the resistor 5 and an output terminal 19 is connected to a node between the PN junction element 8 and the other end of the resistor 6. Output signals, obtained by log-converting the input signals applied to the input terminals 1 and 2, are output through the output terminals 18 and 19. If each of the PN junction elements 7 and 8 is constituted by a plurality of diodes (or diode-connected transistors) connected in series, a node between diodes can be connected to the output terminal 18 or 19.

An operation of the log conversion circuit shown in FIG. 7 will now be described. When input signals $V_{in}^+$ and $V_{in}^-$ are respectively input to the input terminals 1 and 2, they are applied to the first ends of the resistors 5 and 6 via the buffers 3 and 4, respectively. As a result, currents proportional to $V_{in}^+$ and $V_{in}^-$ flow through the resistors 5 and 6. In other words, the input signals are voltage-to-current converted. Since the current sources 10 to 13 are connected to the resistor 5 and the current sources 14 to 17 are connected to the resistor 6, differences in the currents flowing through the resistors 5 and 6 flow through the PN junction elements 7 and 8. Since the PN junction elements 7 and 8 have logarithmic voltage-current characteristics, voltages obtained by log-converting the currents flowing through the PN junction elements 7 and 8 are generated at the output terminals 18 and 19. In other words, output signals obtained by log-converting the input signals ($V_{in}^+$, $V_{in}^-$) are output through the output terminals 18 and 19.

In this case, DC voltage drops of the resistors 5 and 6 can be determined to be relatively low and constant values by selecting the currents of the current sources 10 to 17 to suitable values. Accordingly, if the voltage amplitude range of the input signals $V_{in}$ is the same as in the conventional circuit, the voltage required in the power source $V_{cc}$ is reduced. Alternatively, if the voltage of the power source $V_{cc}$ is the same as in the conventional circuit, the voltage amplitude range of the input signals $V_{in}$ can be wider in accordance with the reduction of the voltage drops in the resistors 5 and 6.

When a gain cell circuit is constituted by the above log conversion circuit in combination with an antilog conversion circuit, as will be described later, the noise level of an output signal can be suppressed by using serially connected diodes as each of the PN junction elements 7 and 8. More specifically, if each of the PN junction elements are a single diode, when an input signal is log-converted (compressed) by the PN junction elements 7 and 8, noise components generated from the PN junction elements 7 and 8 themselves are superposed on signal components. When the signal log-compressed is antilog-converted (expanded), the noise components superposed on the signal components are also expanded, resulting in that the S/N ratio of an output signal is degraded. However, if each of the PN junction elements 7 and 8 is constituted by serially connected diodes, the compression ratio in the log conversion can be reduced and accordingly the expansion ratio in the antilog conversion can be reduced, resulting in that the noise level can be lowered. Consequently, an output signal of a satisfactory S/N ratio can be obtained.

In FIG. 8, the PN junction elements 7 and 8 are serially connected in polarizations opposite to those in FIG. 7. Since the basic operation of the circuit of FIG. 8 is the same as in the circuit of FIG. 7 except for the direction of the currents, detailed descriptions of the operation will be omitted.

A more concrete embodiment of the present invention will be described below.

Figure 9:
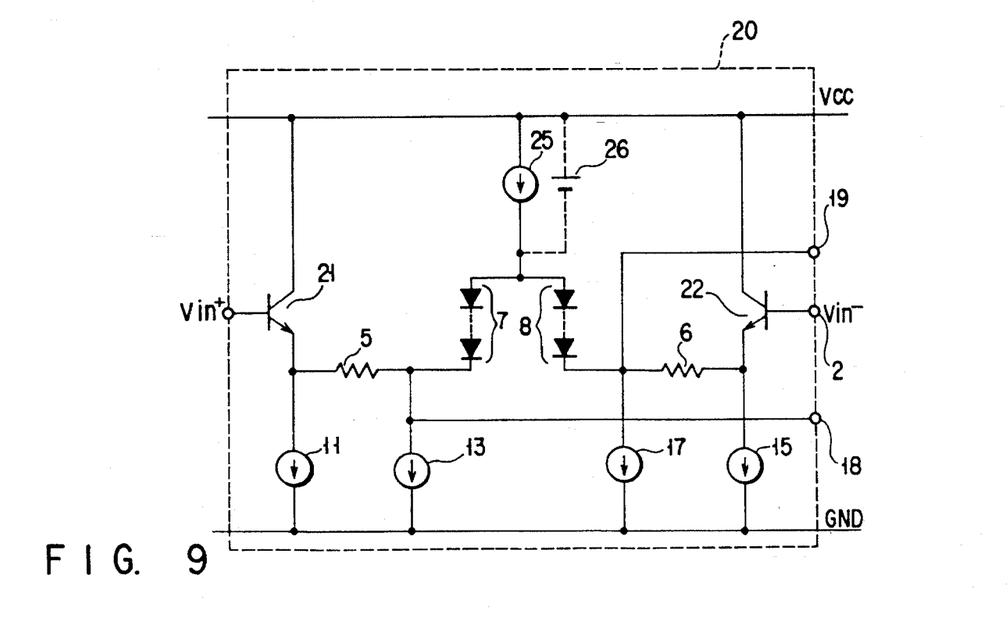
FIG. 9 is a circuit diagram showing a log conversion circuit according to a third embodiment of the present invention.
Figure 10:
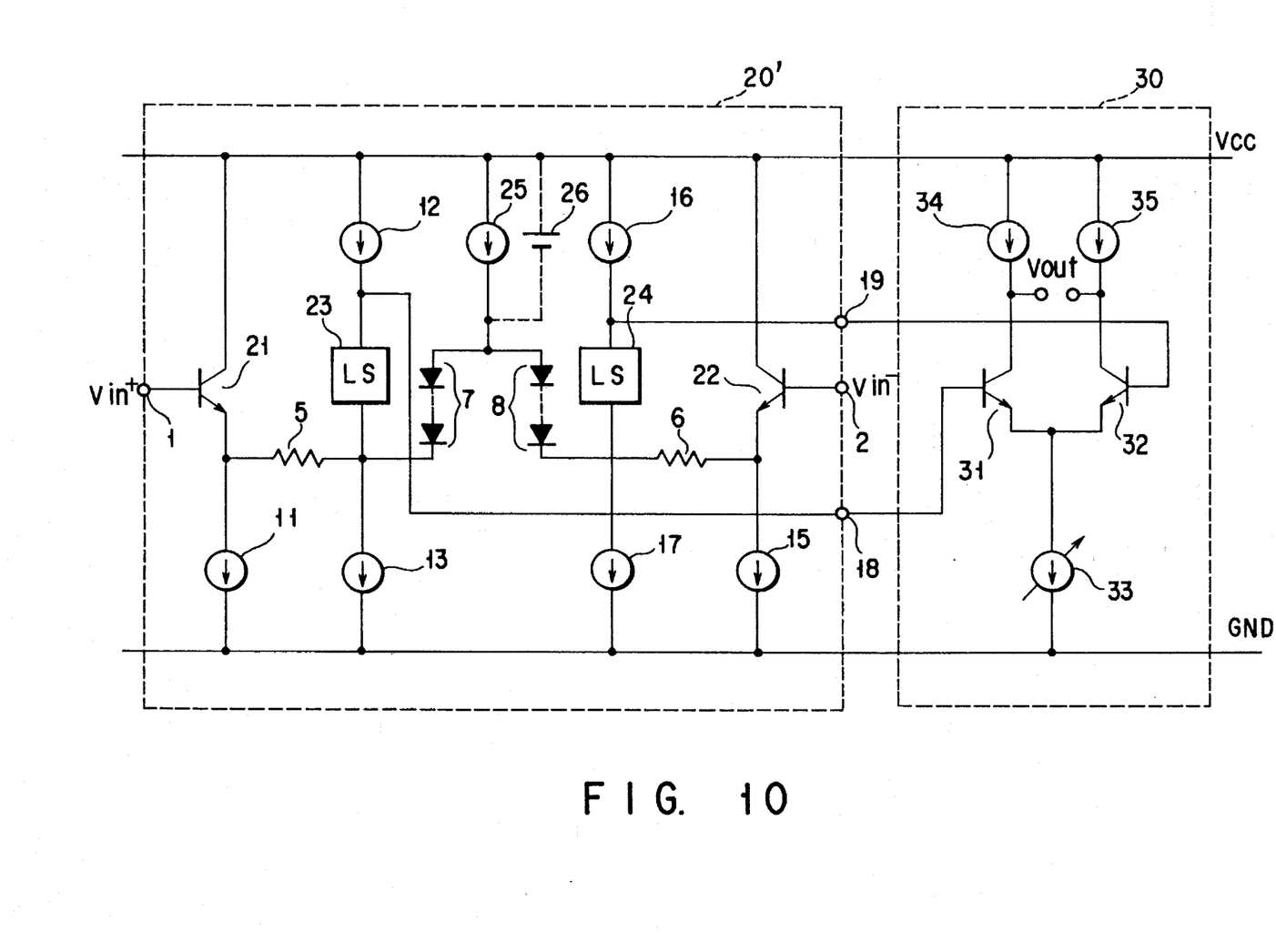
FIG. 10 is a circuit diagram showing a gain cell circuit according to the first embodiment of the present invention.

FIG. 9 shows a log conversion circuit according to a third embodiment of the present invention. FIG. 10 shows a gain cell circuit, according to the first embodiment of the present invention, using a log conversion based on the basic circuit shown in FIG. 7. In a log conversion circuit 20 of the third embodiment, the current sources 12 and 16 and the level shift circuits 23 and 24 are omitted from the circuit of FIG. 10. Log conversion outputs are therefore output directly to output terminals 18 and 19 from the ends of PN junction elements 7 and 8. A log conversion circuit 20' shown in FIG. 10 differs from the log conversion circuit 20 shown in FIG. 9 only in the presence of level shift circuits 23 and 24. Hence, a description of only the log conversion circuit 20' shown in FIG. 10 will be described below and a description of the log conversion circuit 20 will be omitted. The level shift circuits 23 and 24 are provided so that DC potentials at the bases of transistors 31 and 32 connected to the output terminals 18 and 19 coincide with DC potentials at input terminals 1 and 2 of the log conversion circuit 20'.

In FIG. 10, the components corresponding to those shown in FIG. 7 are identified with the same reference numerals as used in FIG. 7. FIG. 10 shows a gain cell circuit including the log conversion circuit 20' of the present invention, arranged in an input stage, and an antilog conversion circuit 30 arranged in an output stage. The gain cell circuit as a whole has linear characteristics. In the log conversion circuit 20' shown in FIG. 10, transistors 21 and 22 constitute emitter followers corresponding to the buffers 3 and 4 of the circuit shown in FIG. 7. The collectors of the transistors 21 and 22 are connected to a first source terminal (positive power source $V_{cc}$) and the emitters thereof are connected to a second source terminal (ground terminal GND) via current sources 11 and 15, respectively. The emitter followers can be replaced by operation amplifiers.

The emitters of the transistors 21 and 22 are connected to first ends of first and second resistors 5 and 6. First and second PN junction elements 7 and 8 are serially connected in opposite polarizations, between the other end of the resistor 5 and the other end of the resistor 6. A current source 25 corresponding to the biasing circuit 9 of FIG. 7 is connected between the first source terminal (power source $V_{cc}$) and a node between the PN junction elements 7 and 8. The current source 25 can be replaced by a voltage source 26.

The other ends of the resistors 5 and 6 are connected to the current sources 12 and 16 via the level shift circuits 23 and 24. A node between the level shift circuit 23 and the current source 12 is connected to the output terminal 18 of the log conversion circuit 20 and a node between the level shift circuit 24 and the current source 16 is connected to the output terminal 19.

The output terminals 18 and 19 of the log conversion circuit 20 are respectively connected to input terminals of the antilog conversion circuit 30, i.e., the bases of transistors 31 and 32. The emitters of the transistors 31 and 32 are coupled with each other and connected to the ground terminal GND through a common current source 33. The collectors of these transistors are connected to the power source $V_{cc}$ through loads, i.e., current sources 34 and 35, respectively. Output signals $V_{out}$ of the gain cell circuit are output through the collectors of the transistors 31 and 32.

An operation of the gain cell circuit will now be described. An input signal $V_{in}$ ($V_{in}^+$, $-V_{in}^-$) is first log-converted by the log conversion circuit 10. More specifically, input signals $V_{in}^+$ and $V_{in}^-$ input through the input terminals 1 and 2, respectively, are voltage-current converted by the resistors 5 and 6 of the transistors 21 and 22. At this time, the emitter currents of the transistors 21 and 22 are changed in accordance with $V_{in}^+$ and $V_{in}^-$. The differences in the currents are respectively supplied to current sources 13 and 17 through the resistors 5 and 6. A current Id1, obtained by subtracting the currents flowing through the resistor 5 and the current source 13 from the current flowing through the current source 12 (the level shift circuit 23), flows through the PN junction element 7. A current Id2, obtained by subtracting the currents flowing through the resistor 6 and the current source 17 from the current flowing through the current source 16 (the level shift circuit 24), flows through the PN junction element 8. Therefore, the following forward voltages Vd1 and Vd2 in accordance with log characteristics are generated on the cathode sides of the PN junction elements 7 and 8:

$$Vd1 = \alpha \cdot \exp(Id1/Is) \quad (2)$$

$$Vd2 = \alpha \cdot \exp(Id2/Is) \quad (3)$$

α: a constant

Is: a saturation current.

The potentials on the cathode sides, log-converted by the current-voltage characteristic of the PN junction elements 7 and 8, are applied to the bases of the transistors 31 and 32 of the antilog conversion circuit 30 via the level shift circuits 23 and 24, respectively. The level shift circuits 23 and 24 are provided for the purpose of causing DC potentials at the bases of transistors 31 and 32 connected to the output terminals 18 and 19 to coincide with DC potentials at input terminals 1 and 2 of the log conversion circuit 20'. Output signals $V_{out}$, obtained by linear-converting the input signal $V_{in}$, are output through the collectors of the transistors 31 and 32.

A gain of the gain cell circuit as a whole, i.e., a transconductance Gm, can be changed by changing the value of a current flowing through the current source 33 connected in common to the emitters of the transistors 31 and 32 of the antilog conversion circuit 30. The transconductance Gm is represented by the following equation (4), assuming that the value of the current flowing through the current source 25 is "Iq", the value of the current flowing through the current source 33 is "Ix", and the resistance of the resistors 5 and 6 is "re":

$$Gm = Ix/(re \cdot Iq) \quad (4)$$

A maximum range of an input voltage in the gain cell circuit, i.e., a maximum amplitude range $V_{in}$p-p of the input signals $V_{in}$, is represented by the following equation, as in the conventional circuit shown in FIG. 1:

$$V_{in}p\text{-}p=100 \cdot re(Io(mA)/26) \ (mV) \qquad (5)$$

where "Io" represents a current value in the current sources 11 and 15.

"Io" of the equation (5) is not contained in the equation (4). Thus, since the maximum range $V_{in}$p-p of the input signals need not be taken into consideration, the current value "Io" of the current sources 11 and 15 can be set so as to cause a substantially no DC current to flow through the resistors 5 and 6. Therefore, since most components of the voltage drops in the resistors 5 and 6 only depend on the input signals $V_{in}$, the input signals, ranging from the power source $V_{cc}$ to the ground terminal GND, can be utilized for normally operating the gain cell circuit.

Figure 11:
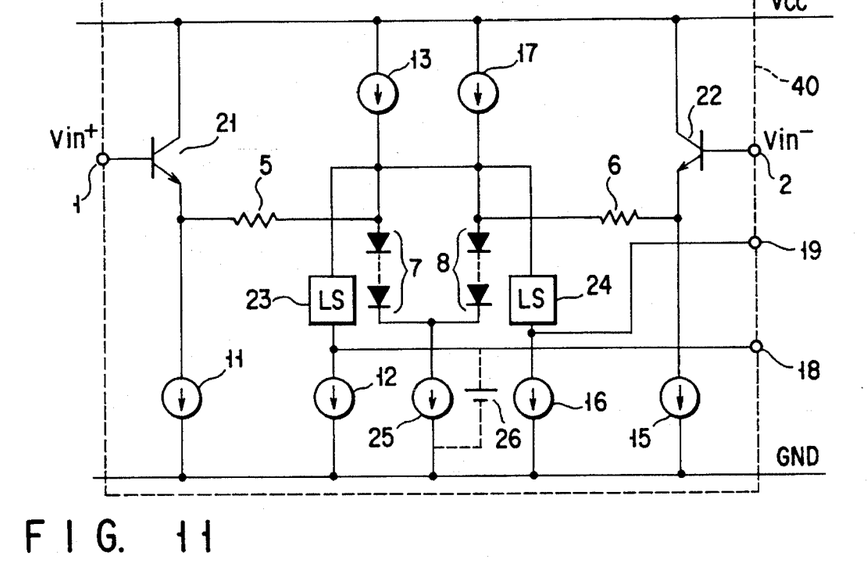
FIG. 11 is a circuit diagram showing a log conversion circuit according to a fourth embodiment of the present invention.

FIG. 11 shows a log conversion circuit according to a fourth embodiment of the present invention. A log conversion circuit 40 of this embodiment is based on the basic structure shown in FIG. 8. PN junction elements 7 and 8 are connected in the polarities opposite to those in FIG. 10. Accordingly, that end of the current source 25, which is not connected to the PN junction elements 7 and 8, is connected to the ground terminal GND. The positional relationship between the current source 12 or 16 and the level shift circuit 23 or 24 is opposite to that as shown in FIG. 10. In this embodiment also, the current source 25 can be replaced by a voltage source 26.

Figure 12:
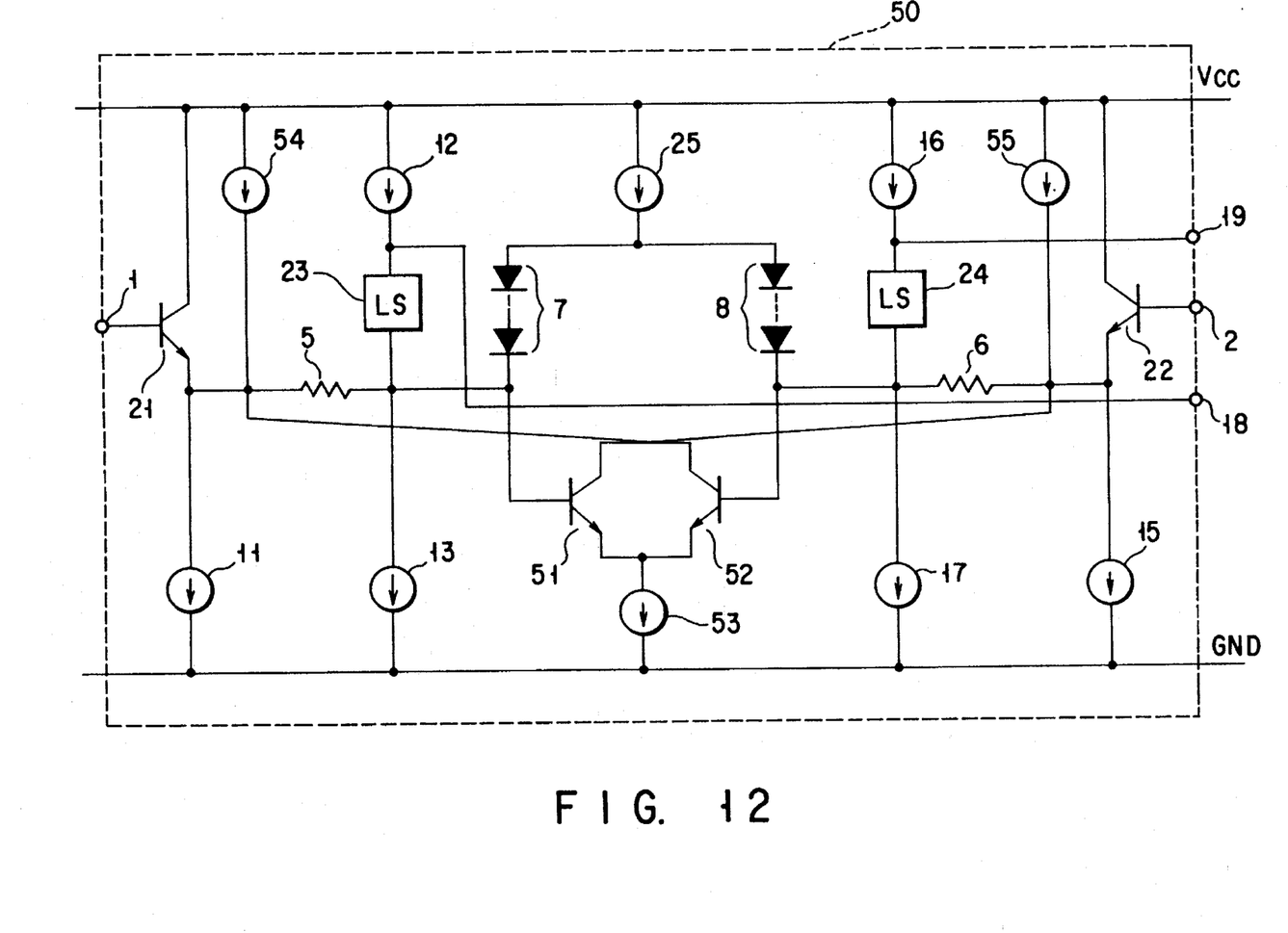
FIG. 12 is a circuit diagram showing a log conversion circuit according to a fifth embodiment of the present invention.

FIG. 12 shows a log conversion circuit according to a fifth embodiment of the present invention. In a log conversion circuit 50 of this embodiment, a linearizing circuit is added to the log conversion circuit 20 shown in FIG. 10, so that a linear operation range can be expanded. More specifically, the circuit of this embodiment comprises a pair of emitter-connected transistors 51 and 52 and current sources 53, 54 and 55, in addition to the elements shown in FIG. 10. The bases of the transistors 51 and 52 are connected to the other ends of the resistors 5 and 6. The collector of the transistor 51 is connected to the emitter of the transistor 22 and to the power source $V_{cc}$ via the current source 54 (collector load). The collector of the transistor 52 is connected to the emitter of the transistor 21 and to the power source $V_{cc}$ via the current source 55 (collector load). A common emitter terminal of the transistors 51 and 52 is connected to the ground terminal GND via the current source 53.

According to this embodiment, a linear operation range can be expanded as will be described in the following.

In general, forward voltages (base-emitter voltages, if the PN junction elements are transistors) Vd1 and Vd2 depend on the values of forward currents flowing therethrough. Base emitter voltages Vbe1 and Vbe2 of the transistors 21 and 22 depend on the values of collector currents. Hence, when the collector currents in the transistors 21 and 22 change in accordance with the voltage of input signals $V_{in}$ ($V_{in}^+$, $-V_{in}^-$) applied to the input terminals 1 and 2, the values of Vd1, Vd2 and Vbe1 and Vbe2 will also change accordingly. Thus, a voltage-current conversion error occurs in the resistors 5 and 6.

However, in this embodiment, since the collector currents in the transistors 51 and 52 are adjusted by means of transistors 21 and 22 so as to control Vbe1 and Vbe2, thereby offsetting the components of Vbe1 and Vbe2 of the transistors 51 and 52 or Vd1 an Vd2 of the serially connected PN junction elements 7 and 8, which depend on the currents. Consequently, an accurate voltage-current conversion can be performed.

Figure 13:
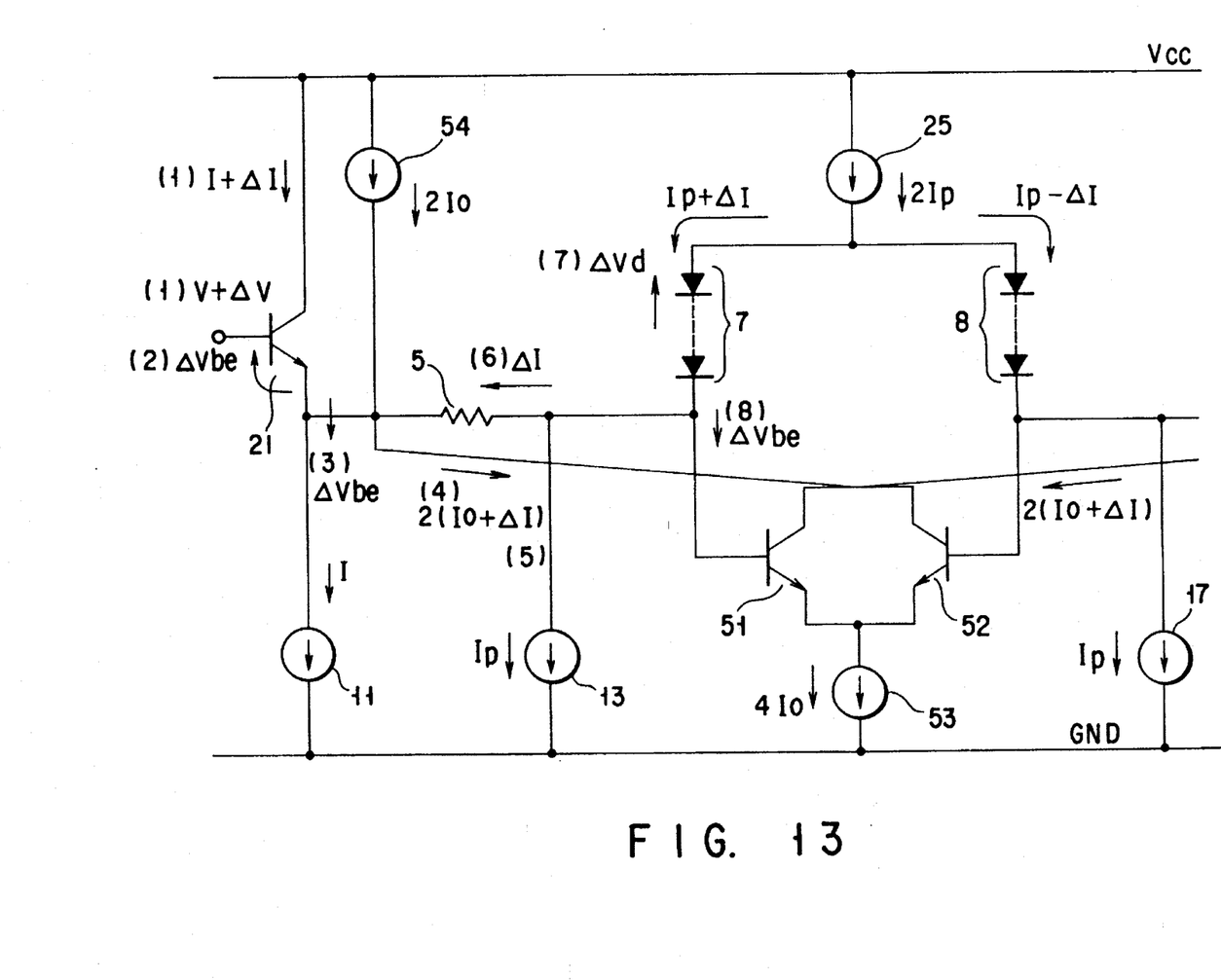
FIG. 13 is a circuit diagram for explaining an operation of the circuit shown in FIG. 12.

An operation of the circuit shown in FIG. 12 will be described in detail with reference to FIG. 13. FIG. 13 shows voltages and currents in the respective portions of a half circuit of the log conversion circuit 50 shown in FIG. 12. In FIG. 13, the current source 12 and the level shift circuit 23 of the circuit shown in FIG. 12 are omitted. Further, numerals representing the following operation steps are added to FIG. 13.

(1) Assume that the voltage of the input signal $V_{in}$ is increased, with the result that the collector current in the transistor 21 is increased by ΔI (I+ΔI).

(2) The base-emitter voltage of the transistor 21 is increased by ΔVbe due to the above operation (1).

(3) Accordingly, the emitter potential of the transistor 21 is reduced by ΔVbe as compared to that in an ideal operation.

(4) The current values of the current sources 53 to 55 are set so that the transconductances Gm of the transistors 51 and 52 are twice those of the transistors 21 and 22, thereby setting the collector current of the transistor 52 to 2(I+ΔI).

(5) The increase ΔI of the collector current of the transistor 21 flows to the collector of the transistor 52.

(6) A difference ΔI between the collector current 2(I+ΔI) of the transistor 52 and the collector current I+ΔI of the transistor 21 flows to the resistor 5.

(7) Since the current ΔI flowing through the resistor 5 is supplied to the PN junction element 7, the forward voltage of the PN junction element 7 is increased by ΔVd (Vd+ΔVd).

(8) As a result of the operation (7), the base potential of the transistor 51 is reduced by ΔVd as compared to that in the ideal operation. On the contrary, the base potential of the transistor 52, which operates differentially with respect to the transistor 51, is increased by ΔVd.

As a result of the operations (5) to (8), the transistors 51 and 52 are looped so as to detect a change in the potential on the cathode sides of the PN junction elements 7 and 8 and to perform a positive feedback of the change.

(9) If ΔVbe=ΔVd, since the potentials at both ends of the resistor 5 are shifted by Δbe in the same direction, a voltage drop due to ΔVbe will not occur in the resistor 5. In other words, the linearity in the voltage drop in the resistor 5, with respect to the voltage change in the input signals $V_{in}$, is increased. The same applies to the resistor 6.

The linearity in the operation region of the log conversion circuit can be improved by the above circuit structure, since it depends on the linearity in the voltage drops in the resistors 5 and 6.

Figure 14:
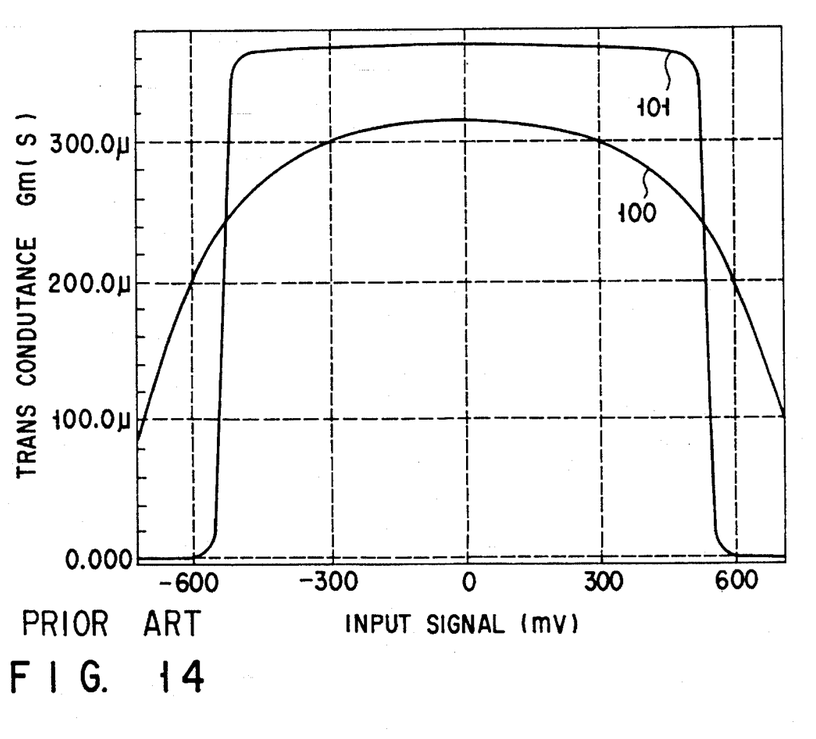
FIG. 14 is a characteristic diagram for comparing transmission characteristics in cases where a linearizing circuit is added and not added to a log conversion circuit.

FIG. 14 is a transmission characteristic diagram showing the input voltage-output current conversion characteristic, i.e., the relationship between an input signal voltage and a transconductance, in the log conversion circuit 20 shown in FIG. 10 and the log conversion circuit 50 (in which a linearizing circuit is added to the circuit 20) shown in FIG. 12. In the diagram, a line 100 indicates the characteristic of the log conversion circuit 20 and a line 101 indicates that of the log conversion circuit 50. In both cases, the antilog conversion circuit 30 is connected to the terminals 18 and 19 and an output signal is output from the collectors of the transistors 31 and 32. The input signal voltage range obtained by the equation (5) is ±0.5 V. As clear from the diagram, the characteristic 101, in the case in which the log conversion circuit is linearized, is substantially flat in this input signal voltage range of ±0.5 V.

Figure 15:
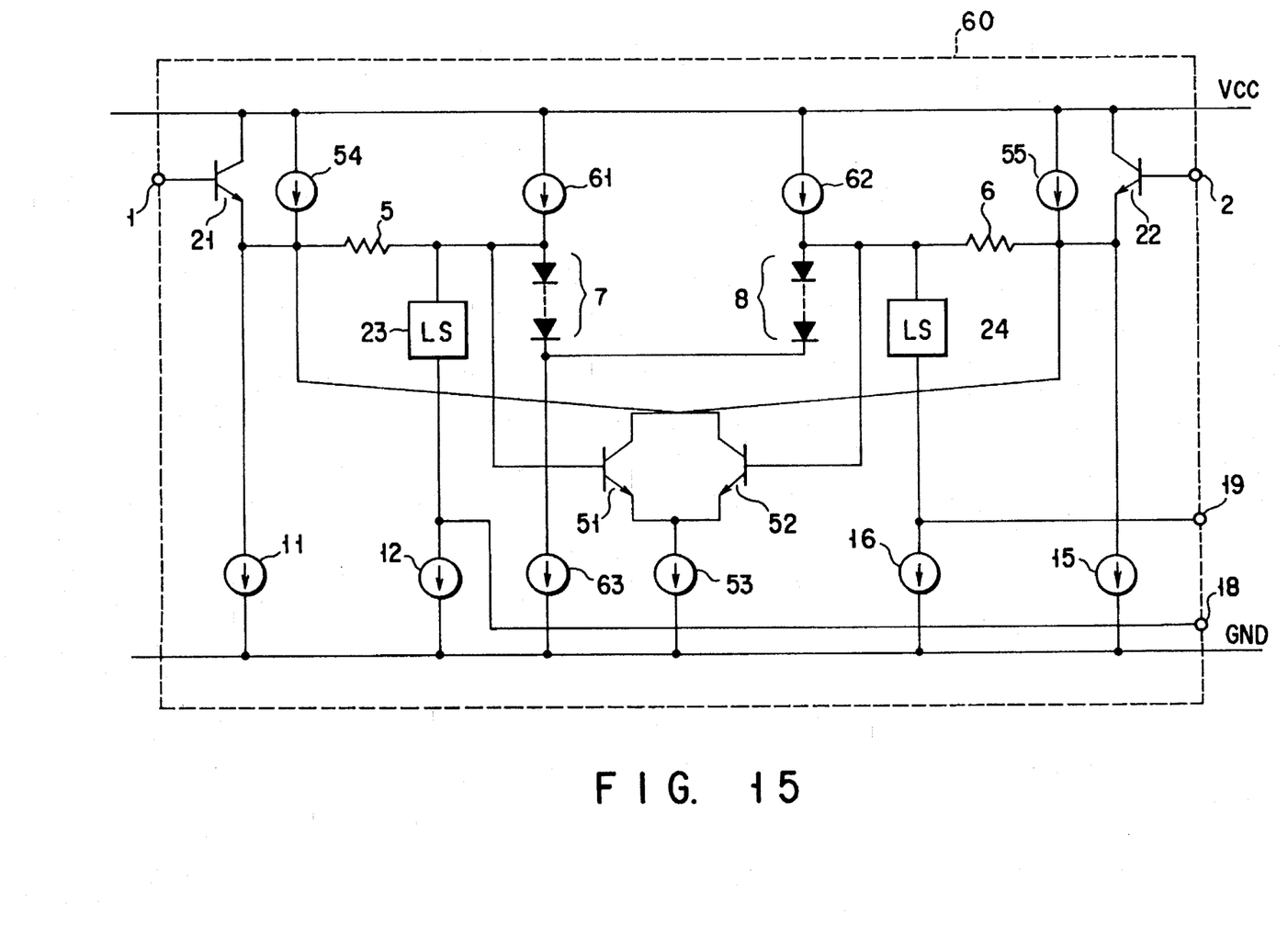
FIG. 15 is a circuit diagram showing a log conversion circuit according to a sixth embodiment of the present invention.

FIG. 15 shows a log conversion circuit according to a sixth embodiment of the present invention. In a log conversion circuit 60 of this embodiment, a linearizing circuit, comprised of a pair of emitter-coupled transistors 51 and 52 and current sources 53, 54 and 55, is added to the log conversion circuit 40 shown in FIG. 11, so that a linear operation range can be expanded. Since the operation principle of this circuit is similar to that of the log conversion circuit shown in FIG. 11, a detailed description thereof will be omitted.

Figure 16:
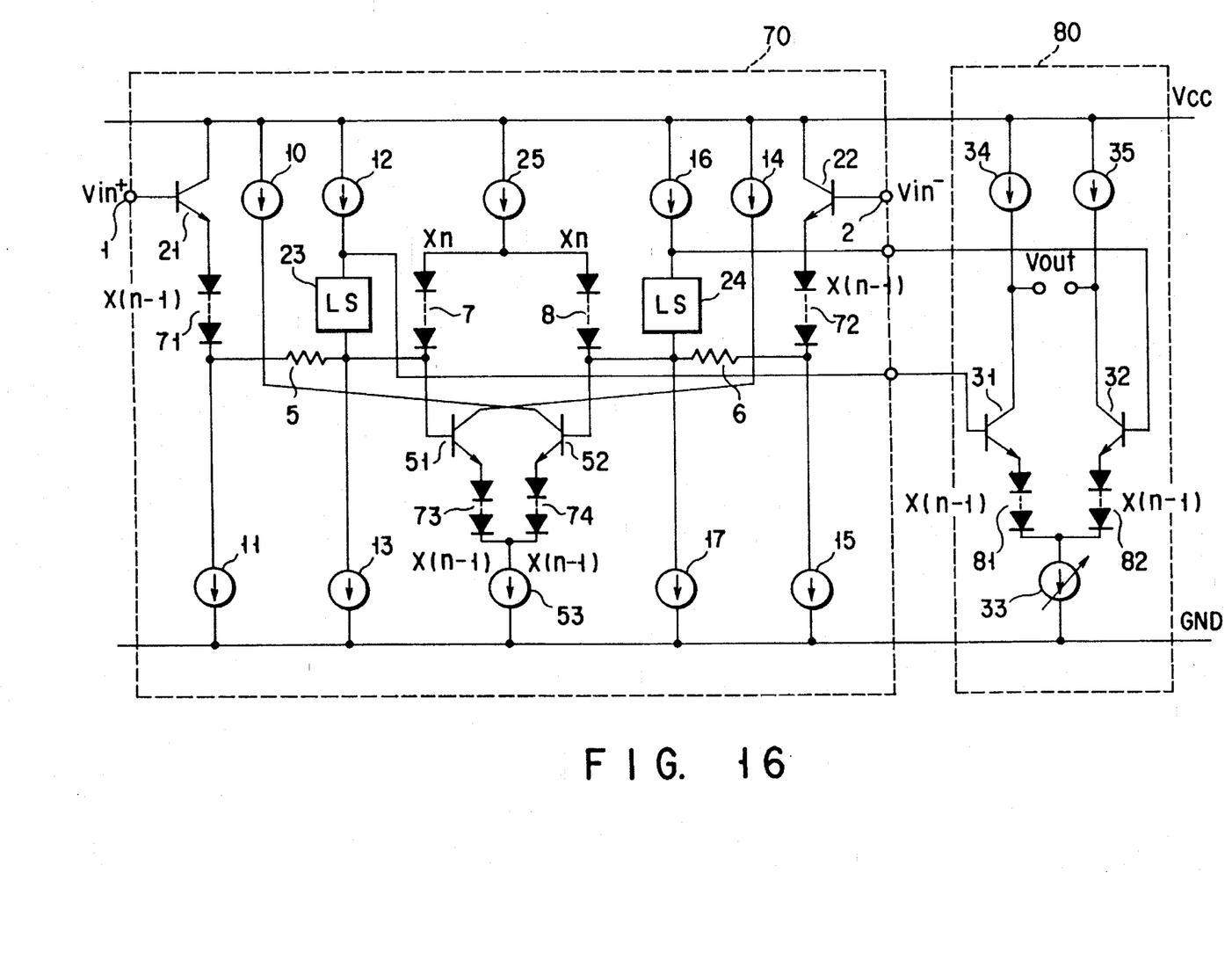
FIG. 16 is a circuit diagram showing a log conversion circuit according to a seventh embodiment of the present invention.

FIG. 16 shows a gain cell circuit according to a seventh embodiment of the present invention. In a log conversion circuit 70 of this embodiment, each of the PN junction elements 7 and 8 has a plurality of (n) elements (diodes or diode-connected transistors) connected in series. An (n–1) number of PN junction elements 71 and 72 are respectively connected to the emitters of the transistors 21 and 22. An (n–1) number of PN junction elements 73 and 74 are respectively connected to the emitters of the transistors 51 and 52 for improving the linearity. Further, an (n–1) number of PN junction elements 81 and 82 are connected to the emitters of the transistors 31 and 32 of the antilog conversion circuit 80. Since the log conversion of the n number of PN junction elements 7 and 8 has an n-th power characteristic, the PN junction elements 81 and 82 are provided for the purpose of linearizing the gain circuit by an n-th root conversion. The PN junction elements 71 to 74 are provided for the purpose of causing the DC levels at the ends of the resistors 5 and 6 to coincide with each other.

Figure 17:
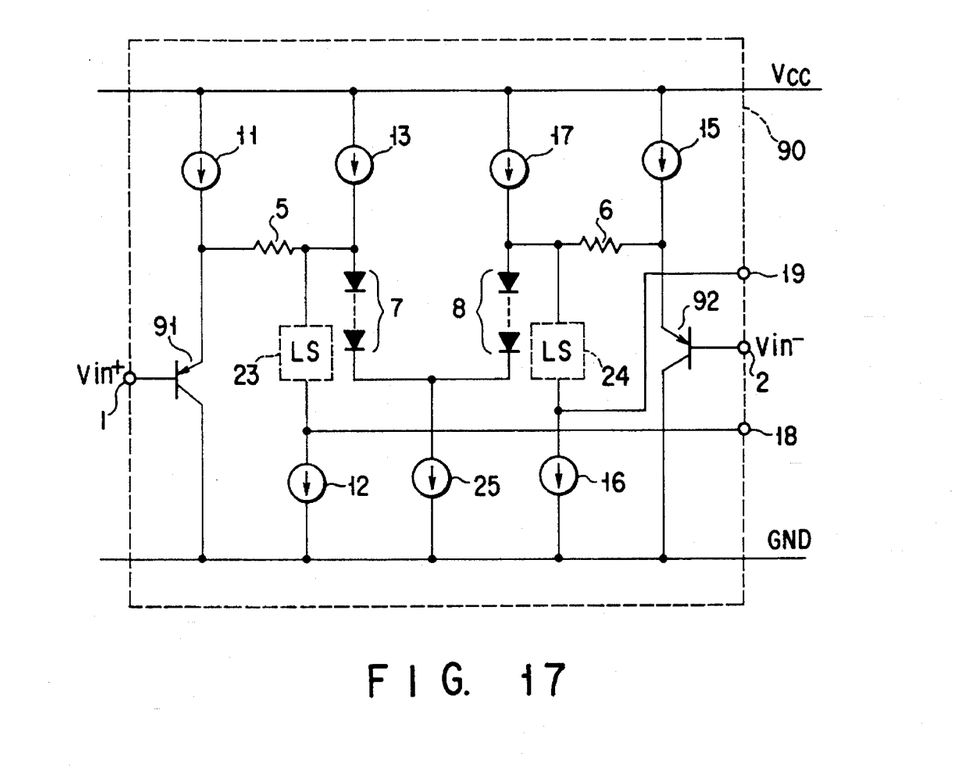
FIG. 17 is a circuit diagram showing a log conversion circuit according to an eighth embodiment of the present invention.

FIG. 17 shows a log conversion circuit according to an eighth embodiment of the present invention. In a log conversion circuit 90 of this embodiment, the npn transistors 21 and 22 in the first to sixth embodiments are replaced by pnp transistors 91 and 92. Accordingly, the positional relationship between the transistor 91 or 92 and the current source 11 or 15 is opposite to that between the transistor 21 or 22 and the current source 11 or 15. Since the basic operation of the log conversion circuit of this embodiment is the same as in the first to sixth embodiments, a description thereof will be omitted. Level shift circuits 23 and 24, indicated by broken lines, can be added. Further, a linearizing circuit as described above can also be added.

Figure 18A:
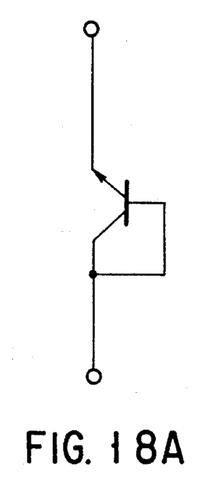
FIGS. 18A to 18D are diagrams showing examples of a level shift circuit.
Figure 18B:
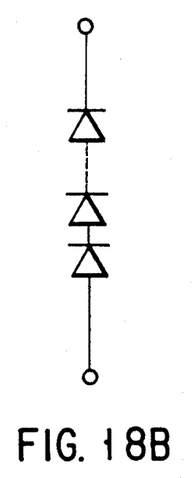
Figure 18C:
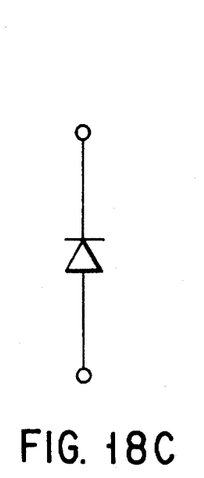
Figure 18D:
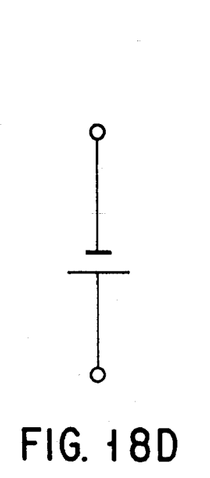

FIGS. 18A to 18D are diagrams showing concrete examples of the level shift circuits used in the above embodiments. FIG. 18A shows a diode-connected transistor, FIG. 18B shows a plurality of diodes connected in series, FIG. 18C shows a diode and FIG. 18D shows a DC voltage source. In each of the circuits shown in FIGS. 18B and 18C, the output side is connected to a power source $V_{cc}$ or a ground terminal GND via a resistor or a current source.

As has been described above, the present invention provides a log conversion circuit which operates with a low source voltage within a large amplitude, without reducing the input voltage operation range.

Further, if the log conversion circuit has a linearizing circuit for controlling the collector current of an emitter follower or the current flowing through a PN junction element for log conversion, the linear operation range can be expanded.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A circuitry having a log converting function comprising:

first and second input sections to which voltage signals are input;

a log element section having first and second nodes and including first and second PN junction elements connected in series in opposite polarities between the first and second nodes;

a first degenerating resistor for converting the voltage signal input to the first input section to a current signal, said first degenerating resistor connected between the first input section and the first node of the log element section, so that the current signal can flow therethrough;

a second degenerating resistor for converting the voltage signal input to the second input section to a current signal, said second degenerating resistor connected between the second input section and the second node of the log element section, so that the current signal can flow therethrough;

first and second output sections for outputting voltage signals generated at the first and second nodes of the log element section; and means for determining potentials at both connections of the first and second degenerating resistors.

2. The circuitry according to claim 1, further comprising a linearizing circuit, connected between the first and second output sections, for expanding a linear operation range of the voltage signals output through the first and second output sections.

3. The circuitry according to claim 1, further comprising an antilog conversion circuit for antilog-converting the voltage signals output from the first and second output sections.

4. A circuitry comprising:

first and second source terminals;

first and second input terminals to which voltage signals are input;

first and second resistors having first ends respectively connected to the first and second input terminals;

first and second PN junction element sections connected in series and in opposite polarities, the series-connected first and second PN junction element sections having its ends connected between a second end of the first resistor and a second end of the second resistor;

a biasing circuit connected between the first source terminal and a node between the first and second PN junction element sections;

first and second current source means for determining potentials at both ends of the first resistor, the first current source means connected between the first end of the first resistor and the first and second source terminals, and the second current source means being connected between the second end of the first resistor and the first and second source terminals;

third and fourth current source means for determining potentials at both ends of the second resistor, the third current source means connected between the first end of the second resistor and the first and second source terminals, and the fourth current source means being connected between the second end of the second resistor and the first and second source terminals; and first and second output terminals for outputting voltage signals generated at both ends of the series-connected first and second PN junction element sections.

5. A circuitry comprising:

first and second source terminals;

first and second input terminals to which voltage signals are input;

first and second emitter followers, bases of which are respectively connected to the first and second input terminals;

first and second resistors having first ends respectively connected to emitters of the first and second emitter followers;

first and second PN junction element sections connected in series and in opposite polarities, the series-connected first and second PN junction element sections having its ends connected between a second end of the first resistor and a second end of the second resistor;

a biasing circuit connected between the first source terminal and a node between the first and second PN junction element sections;

first and second current source means for determining potentials at both ends of the first resistor, the first current source means connected between the first end of the first resistor and the first and second source terminals, and the second current source means being connected between the second end of the first resistor and the first and second source terminals;

third and fourth current source means for determining potentials at both ends of the second resistor, the third current source means connected between the first end of the second resistor and the first and second source terminals, and the fourth current source means being connected between the second end of the second resistor and the first and second source terminals;

first and second output terminals for outputting voltage signals generated at both ends of the series-connected first and second PN junction element sections;

a pair of emitter-coupled transistors, base of which are respectively connected to the second ends of the first and second resistors, emitters of which are connected to each other to form a common emitter terminal, and collectors of which are respectively connected to the emitter of the second emitter follower and the emitter of the first emitter follower; and a current source connected to the common emitter terminal of the pair of emitter-coupled transistors.

6. The circuitry according to claim 1, wherein the first and second input sections include emitter followers each of which is constituted by an NPN transistor, and the log element section includes said PN junction elements each having cathode terminals connected to the first and second input sections through the first and second degenerating resistors and anode terminals connected to each other.

7. The circuitry according to claim 1, wherein the first and second input sections include emitter followers each of which is constituted by an NPN transistor, and the log element section includes said PN junction elements each having anode terminals connected to the first and second input sections through the first and second degenerating resistors and cathode terminals connected to each other.

8. The circuitry according to claim 3, wherein each of the first and second input sections includes a level shift circuit for changing a DC potential of the voltage signal output through the first or second output sections in accordance with a DC potential of the voltage signal input to the first or second input section.

9. The circuitry according to claim 1, further including a biasing circuit connected between a power source and a third node located between the first and second PN junction element sections.

* * * * *